(12) United States Patent
Kosaka et al.

(10) Patent No.: US 9,778,559 B2
(45) Date of Patent: Oct. 3, 2017

(54) METHOD FOR PREPARING HALFTONE PHASE SHIFT PHOTOMASK BLANK

(71) Applicant: Shin-Etsu Chemical Co., Ltd., Tokyo (JP)

(72) Inventors: Takuro Kosaka, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 76 days.

(21) Appl. No.: 15/078,114

(22) Filed: Mar. 23, 2016

(65) Prior Publication Data

US 2016/0291454 A1   Oct. 6, 2016

(30) Foreign Application Priority Data

Mar. 31, 2015 (JP) .................. 2015-072925
Apr. 1, 2015 (JP) .................. 2015-074783

(51) Int. Cl.
   *G03F 1/26* (2012.01)
   *C23C 14/34* (2006.01)
   *G03F 1/32* (2012.01)
   *G03F 1/28* (2012.01)
   *G03F 1/68* (2012.01)

(52) U.S. Cl.
   CPC .................. *G03F 1/32* (2013.01); *G03F 1/28* (2013.01); *G03F 1/68* (2013.01)

(58) Field of Classification Search
   None
   See application file for complete search history.

(56) References Cited

U.S. PATENT DOCUMENTS

| 5,474,864 | A | 12/1995 | Isao et al. |
| 6,203,674 | B1 * | 3/2001 | Yamaguchi ......... C23C 14/0042 |
| | | | 204/192.15 |
| 7,767,366 | B2 | 8/2010 | Yoshikawa et al. |
| 7,771,893 | B2 | 8/2010 | Yoshikawa et al. |
| 7,941,767 | B2 | 5/2011 | Mukai et al. |
| 2008/0041716 | A1 * | 2/2008 | Alpay ................ C23C 14/0084 |
| | | | 204/192.2 |

FOREIGN PATENT DOCUMENTS

| JP | 7-140635 A | 6/1995 |
| JP | 2007-33469 A | 2/2007 |
| JP | 2007-233179 A | 9/2007 |
| JP | 2007-241065 A | 9/2007 |
| JP | 2008-276002 A | 11/2008 |

* cited by examiner

*Primary Examiner* — Stephen Rosasco
(74) *Attorney, Agent, or Firm* — Birch, Stewart, Kolasch & Birch, LLP

(57) ABSTRACT

A halftone phase shift film containing Si and N and/or O is deposited on a transparent substrate by reactive sputtering of a Si-containing target with a reactive gas containing N and/or O. One layer is sputter deposited while the reactive gas flow rate is set equal to or lower than the lower limit of the reactive gas flow rate in the hysteresis region, and another layer is sputter deposited while the reactive gas flow rate is set inside the lower and upper limits of the reactive gas flow rate in the hysteresis region. The phase shift film exhibits satisfactory in-plane uniformity of optical properties.

6 Claims, 1 Drawing Sheet

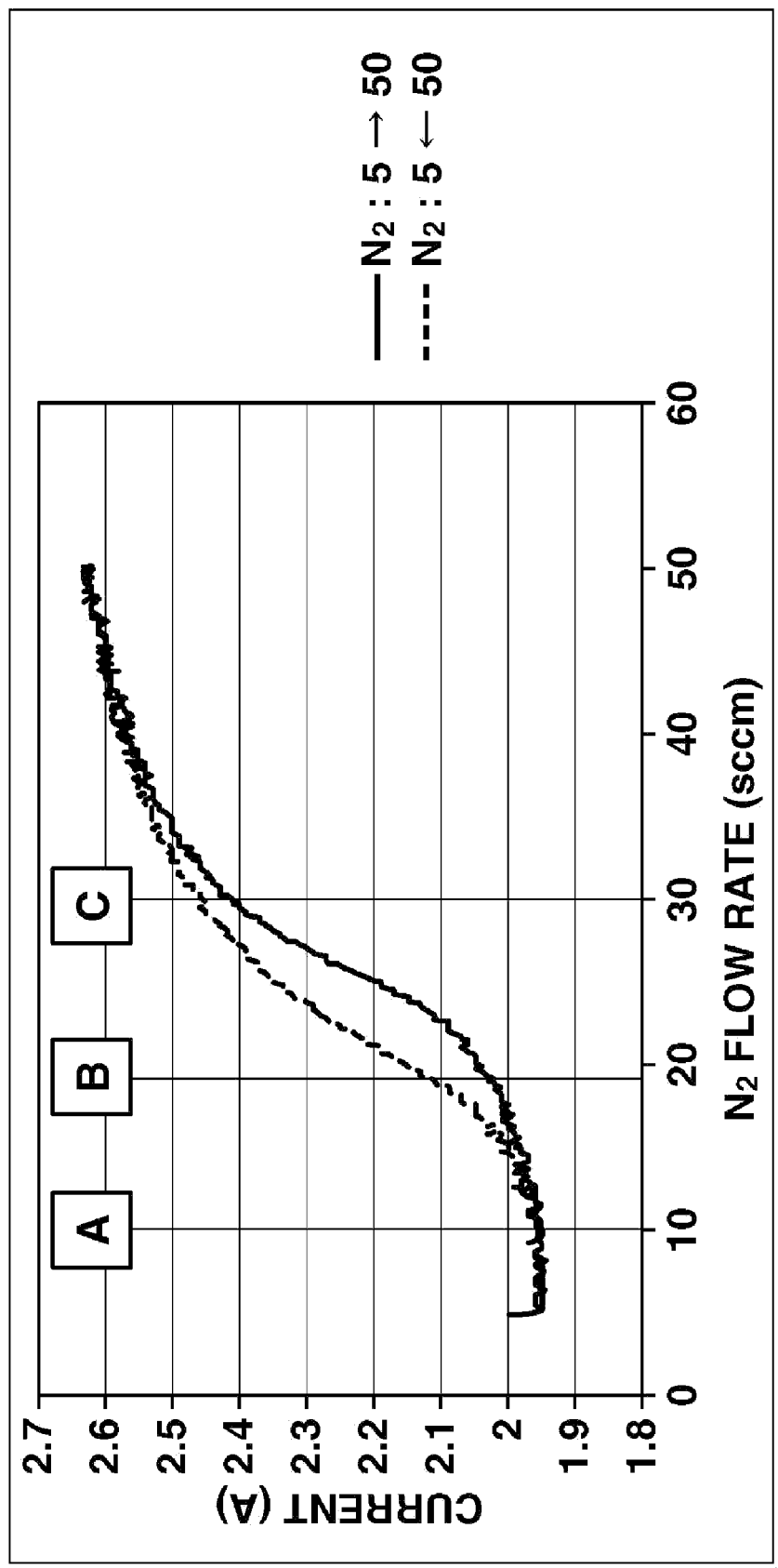

METHOD FOR PREPARING HALFTONE PHASE SHIFT PHOTOMASK BLANK

CROSS-REFERENCE TO RELATED APPLICATION

This non-provisional application claims priority under 35 U.S.C. §119(a) on Patent Application Nos. 2015-072925 and 2015-074783 filed in Japan on Mar. 31, 2015 and Apr. 1, 2015, respectively, the entire contents of which are hereby incorporated by reference.

TECHNICAL FIELD

This invention relates to a method for preparing a halftone phase shift photomask blank which is processed into a halftone phase shift photomask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of a phase shift of approximately 180 degrees and having an insufficient transmittance to contribute to pattern formation. As the halftone phase shift photomask, Patent Document 1 (JP-A H07-140635) proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, Patent Document 2 (JP-A 2008-276002) describes that if the photomask is cleaned at a predetermined stage, then the photomask can be continuously used.

CITATION LIST

Patent Document 1: JP-A H07-140635
Patent Document 2: JP-A 2008-276002 (U.S. Pat. No. 7,941,767)
Patent Document 3: JP-A 2007-033469
Patent Document 4: JP-A 2007-233179
Patent Document 5: JP-A 2007-241065

SUMMARY OF INVENTION

The photomask technology has the tendency that with a progress of miniaturization, the pattern width becomes smaller than the exposure wavelength. Accordingly, RET technologies such as OPC, modified illumination, immersion lithography, phase shift method, and double exposure are employed as mentioned above. With respect to the phase shift film, a thinner film is advantageous for pattern formation and effective for reducing 3D effect. Thus a thinner film is required in order for photolithography to form a finer size pattern.

On use of a photomask blank in the photomask producing process, if foreign deposits are on the photomask blank, they cause defects to the pattern. To remove foreign deposits, the photomask blank is cleaned many times during the photomask producing process. Further, when the photomask thus produced is used in the photolithography process, the photomask is also repeatedly cleaned even if the photomask itself is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or AMP. SPM is a sulfuric acid/hydrogen peroxide mixture which is a cleaning agent having strong oxidizing action. Ozone water is water having ozone dissolved therein and used as a replacement of SPM. AMP is an aqueous ammonia/hydrogen peroxide mixture. When the photomask blank or photomask having organic foreign deposits on its surface is immersed in the AMP cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage an optical film, typically halftone phase shift film, on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film during every cleaning step.

Among the films meeting the above requirements are films containing silicon and nitrogen and/or oxygen, for example, transition metal-free films consisting of silicon and nitrogen, and transition metal-free films consisting of silicon, nitrogen and oxygen, which have improved chemical resistance.

In general, pattern-forming thin films on photomask blanks are formed by the sputtering technique. For example, a film consisting of silicon and nitrogen (i.e., SiN film) is formed on a transparent substrate by placing a Si target in a deposition chamber, feeding a gas mixture of rare gas (e.g., Ar) and nitrogen gas into the chamber, creating a gas plasma, sputtering the Si target with energized particles, and letting sputtered Si particles deposit on the substrate while entrapping nitrogen on the way and reacting with nitrogen on the target surface or substrate surface. The nitrogen content of the SiN film may be controlled by increasing or decreasing the mixing ratio of nitrogen gas in the gas mixture. Then a SiN film having any desired nitrogen content can be deposited on a transparent substrate.

When a SiN film is deposited using a Si target, however, stable film deposition becomes difficult in a certain region, depending on the flow rate of nitrogen gas in the gas mixture. The film deposited in that region is difficult to control its optical properties including phase shift and transmittance. In particular, it is difficult to form a film having in-plane uniformity of optical properties at a predetermined transmittance, e.g., a transmittance of up to 15% while maintaining a predetermined phase shift, e.g., a phase shift of substantially 180°.

An object of the invention is to provide a method for preparing a halftone phase shift photomask blank comprising a halftone phase shift film containing silicon and nitrogen and/or oxygen and having in-plane uniformity of optical properties.

As the halftone phase shift film having chemical resistance, attention is paid to halftone phase shift films containing silicon, and nitrogen and/or oxygen. A study is made to develop halftone phase shift films which are improved in in-plane uniformity of optical properties while maintaining a predetermined phase shift. The invention pertains to a method for preparing a halftone phase shift photomask blank comprising the step of depositing a halftone phase shift film containing silicon on a transparent substrate by reactive sputtering of a silicon-containing target with a reactive gas. The halftone phase shift film is composed of a plurality of layers including first and second layers. It is provided that a hysteresis curve is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas. The inventors have found that better results are obtained when one layer of the first and second layers is sputter deposited while the flow rate of the reactive gas is set equal to or lower than the lower limit of the reactive gas flow rate in the hysteresis region, and the other layer is sputter deposited while the flow rate of the reactive gas is set inside the lower and upper limits of the reactive gas flow rate in the hysteresis region. There is obtained a photomask blank having a halftone phase shift film which is improved in chemical resistance and in-plane uniformity of optical properties while maintaining a predetermined phase shift. The halftone phase shift film with improved in-plane uniformity can be formed in a reproducible manner.

The invention provides a method for preparing a halftone phase shift photomask blank comprising the step of depositing a halftone phase shift film containing silicon and nitrogen and/or oxygen on a transparent substrate, by reactive sputtering of a silicon-containing target with a reactive gas containing nitrogen and/or oxygen, the halftone phase shift film comprising first and second layers. Provided that a hysteresis curve defining a hysteresis region is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas, one layer of the first and second layers is sputter deposited while the flow rate of the reactive gas is set equal to or lower than the lower limit of the flow rate of the reactive gas in the hysteresis region, and the other layer is sputter deposited while the flow rate of the reactive gas is set inside the lower and upper limits of the flow rate of the reactive gas in the hysteresis region.

In a preferred embodiment, the other layer is sputter deposited while the flow rate of the reactive gas is set such that the difference between a target voltage value $V_A$ recorded during the ascent of the reactive gas flow rate and a target voltage value $V_D$ recorded during the descent of the reactive gas flow rate is within ±15% of the difference between the target voltage value $V_L$ at the lower limit of the reactive gas flow rate in the hysteresis region and the target voltage value $V_H$ at the upper limit of the reactive gas flow rate in the hysteresis region, or the difference between a target current value $I_A$ recorded during the ascent of the reactive gas flow rate and a target current value $I_D$ recorded during the descent of the reactive gas flow rate is within ±15% of the difference between the target current value $I_L$ at the lower limit of the reactive gas flow rate in the hysteresis region and the target current value $I_H$ at the upper limit of the reactive gas flow rate in the hysteresis region.

In a preferred embodiment, the other layer is sputter deposited while the reactive gas flow rate is set equal to or more than an average value between the lower and upper limits of the reactive gas flow rate in the hysteresis region.

Preferably, the reactive gas contains nitrogen ($N_2$) gas or oxygen ($O_2$) gas, and the silicon-containing target is a target consisting of silicon.

Most often, the halftone phase shift film is free of transition metals.

Advantageous Effects of Invention

In connection with a halftone phase shift photomask blank having a halftone phase shift film containing silicon, and nitrogen and/or oxygen, the invention provides a halftone phase shift film which is improved in chemical resistance and in-plane uniformity of optical properties while maintaining the predetermined phase shift.

BRIEF DESCRIPTION OF DRAWINGS

FIG. 1 is a diagram showing a hysteresis curve drawn in Example 1.

DESCRIPTION OF PREFERRED EMBODIMENTS

According to the invention, a halftone phase shift photomask blank is prepared by reactive sputtering of a silicon-containing target with a reactive gas containing one or both of nitrogen and oxygen to deposit a halftone phase shift film containing silicon and one or both of nitrogen and oxygen on a transparent substrate, typically quartz substrate.

In an experiment, reactive sputtering is performed in a chamber in vacuum or reduced pressure using a target and a reactive gas. While the power applied across the target is kept constant, the flow rate of the reactive gas is gradually increased from the zero gas feed state. As the flow rate of the reactive gas is increased, the voltage measured across the target (i.e., target voltage) gradually declines. The voltage behavior is such that the voltage follows a slow decline (at a gentle slope) at the initial, a rapid decline (at a sharp slope) midway, and finally a slow decline (at a gentle slope) again. After the flow rate of the reactive gas is increased over the range where the voltage takes a slow decline again, inversely the flow rate of the reactive gas is decreased. As the flow rate of the reactive gas is decreased, the voltage measured across the target (i.e., target voltage) gradually increases. At this stage, the voltage behavior is such that the voltage follows a slow increase (at a gentle slope) at the initial, a rapid increase (at a sharp slope) midway, and finally a slow increase (at a gentle slope) again. When the target voltage recorded during the ascent of reactive gas flow rate and the target voltage recorded during the descent of reactive gas flow rate are compared, the target voltage recorded during the descent of reactive gas flow rate is lower in the region of the rapid decline or increase (at a sharp slope).

In another experiment, reactive sputtering is performed in a chamber in vacuum or reduced pressure using a target and a reactive gas. While the power applied across the target is kept constant, the flow rate of the reactive gas is gradually increased from the zero gas feed state. As the flow rate of the reactive gas is increased, the current measured across the target (i.e., target current) gradually increases. The current behavior is such that the current follows a slow increase (at a gentle slope) at the initial, a rapid increase (at a sharp slope) midway, and finally a slow increase (at a gentle slope) again. After the flow rate of the reactive gas is increased over the range where the current takes a slow increase again, inversely the flow rate of the reactive gas is decreased. As the flow rate of the reactive gas is decreased, the current measured across the target (i.e., target current) gradually declines. At this stage, the current behavior is such that the current follows a slow decline (at a gentle slope) at the initial, a rapid decline (at a sharp slope) midway, and finally a slow decline (at a gentle slope) again. When the target current recorded during the ascent of reactive gas flow rate and the target current recorded during the descent of reactive gas flow rate are compared, the target current recorded during the descent of reactive gas flow rate is higher in the region of the rapid increase or decline (at a sharp slope).

As is evident from the above reactive sputtering experiments, a hysteresis curve as shown in FIG. 1, for example, and similar to the well-known magnetic hysteresis curve (B-H curve), is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas.

The hysteresis curve is delineated by the target voltage or current recorded during the ascent of the reactive gas flow rate and the target voltage or current recorded during the descent of the reactive gas flow rate. A hysteresis region is defined by the curve segments. In the hysteresis region, the lower and upper limits of the flow rate of reactive gas correspond to the points where the target voltage or current value recorded during the ascent of reactive gas flow rate and the target voltage or current value recorded during the descent of reactive gas flow rate become substantially equal. Specifically, on the assumption that a percent change is determined from the formula (1-1):

$$(V_A - V_D)/\{(V_A + V_D)/2\} \times 100 \quad (1\text{-}1)$$

wherein $V_A$ is a target voltage value recorded during the ascent of reactive gas flow rate and $V_D$ is a target voltage value recorded during the descent of reactive gas flow rate, or a percent change is determined from the formula (1-2):

$$(I_D - I_A)/\{(I_A - I_D)/2\} \times 100 \quad (1\text{-}2)$$

wherein $I_A$ is a target current value recorded during the ascent of reactive gas flow rate and $I_D$ is a target current value recorded during the descent of reactive gas flow rate, the points when the percent change of formula (1-1) or (1-2) gradually decreases from the center of the hysteresis region toward the lower or upper limit side, and reaches 2% or less, especially substantially zero, are the lower and upper limits of the reactive gas flow rate in the hysteresis region.

It is believed that during sputtering at a reactive gas flow rate equal to or below the lower limit of the hysteresis region, once the reactive gas is adsorbed to the target surface, it is released as sputtered particles from the target surface, so that the erosion portion of the target surface is maintained in the metallic state (silicon is inclusive in the metal herein), which is also referred to as "metal mode." Also, during sputtering at a reactive gas flow rate equal to or above the upper limit of the hysteresis region, the target surface reacts with the reactive gas and takes the state that the target surface is completely covered with a metal compound, which is also referred to as "reaction mode." On the other hand, during sputtering at a reactive gas flow rate above the lower limit and below the upper limit of the hysteresis region, the erosion portion of the target surface is partially covered with the metal compound, which is also referred to as "transition mode."

For the photomask blank, the in-plane uniformity of a film is important. As the halftone phase shift film, a film containing silicon is generally used. Oxygen, nitrogen or the like must be added to the film in order to provide the film with a certain transmittance. To form a silicon-containing film having a predetermined phase shift and a predetermined transmittance, the film must be deposited in the transition mode. Film deposition in the transition mode, however, tends to degrade in-plane uniformity. In the reaction mode, the deposition rate is slow and the target surface is readily insulated. For this reason, in the practice of the invention, reactive sputtering is performed by combining a reactive gas flow rate in the metal mode and a reactive gas flow rate in the transition mode.

Specifically, the halftone phase shift film is composed of a plurality of layers, preferably 2 to 10 layers, including first and second layers. Of the first and second layers, one layer is sputter deposited while the reactive gas flow rate is set equal to or lower than the lower limit of the reactive gas flow rate in the hysteresis region, and the other layer is sputter deposited while the reactive gas flow rate is set inside the lower and upper limits of the reactive gas flow rate in the hysteresis region ("inside" being used in a sense exclusive of limits).

In a preferred embodiment, the other layer is sputter deposited while the flow rate of the reactive gas is set such that the difference between the target voltage value $V_A$ recorded during the ascent of the reactive gas flow rate and the target voltage value $V_D$ recorded during the descent of the reactive gas flow rate is within ±15% (i.e., from −15% to +15%), more preferably within ±10% (i.e., from −10% to +10%) of the difference between the target voltage value $V_L$ at the lower limit of the reactive gas flow rate in the hysteresis region and the target voltage value $V_H$ at the upper limit of the reactive gas flow rate in the hysteresis region; or the difference between the target current value $I_A$ recorded during the ascent of the reactive gas flow rate and the target current value $I_D$ recorded during the descent of the reactive gas flow rate is within ±15% (i.e., from −15% to +15%), more preferably within ±10% (i.e., from −10% to +10%) of the difference between the target current value $I_L$ at the lower limit of the reactive gas flow rate in the hysteresis region and the target current value $I_H$ at the upper limit of the reactive gas flow rate in the hysteresis region.

Herein, as the target voltage value $V_L$ at the lower limit of the reactive gas flow rate in the hysteresis region and the target voltage value $V_H$ at the upper limit of the reactive gas flow rate in the hysteresis region, an average of target voltage values recorded during the ascent of the reactive gas flow rate and an average of target voltage values recorded during the descent of the reactive gas flow rate may be applicable, respectively. Likewise, as the target current value $I_L$ at the lower limit of the reactive gas flow rate in the hysteresis region and the target current value $I_H$ at the upper limit of the reactive gas flow rate in the hysteresis region, an average of target current values recorded during the ascent of the reactive gas flow rate and an average of target current values recorded during the descent of the reactive gas flow rate may be applicable, respectively.

The invention is most effective when there is obtained a hysteresis curve ensuring that a percent change of voltage determined from the target voltage value $V_L$ at the lower limit of the reactive gas flow rate in the hysteresis region and the target voltage value $V_H$ at the upper limit of the reactive gas flow rate in the hysteresis region according to the formula (2-1):

$$(V_L - V_H)/\{(V_L + V_H)/2\} \times 100 \qquad (2\text{-}1)$$

or a percent change of current determined from the target current value $I_L$ at the lower limit of the reactive gas flow rate in the hysteresis region and the target current value $I_H$ at the upper limit of the reactive gas flow rate in the hysteresis region according to the formula (2-2):

$$(I_H - I_L)/\{(I_L + I_H)/2\} \times 100 \qquad (2\text{-}2)$$

is at least 15%.

Also the invention is most effective when there is obtained a hysteresis curve ensuring that the difference between the target voltage value $V_A$ recorded during the ascent of the reactive gas flow rate and the target voltage value $V_D$ recorded during the descent of the reactive gas flow rate as averages between the lower and upper limits of the reactive gas flow rate in the hysteresis region is at least +10% or up to −10% of the difference between the target voltage value $V_L$ at the lower limit of the reactive gas flow rate in the hysteresis region and the target voltage value $V_H$ at the upper limit of the reactive gas flow rate; or the difference between the target current value $I_A$ recorded during the ascent of the reactive gas flow rate and the target current value $I_D$ recorded during the descent of the reactive gas flow rate as averages between the lower and upper limits of the reactive gas flow rate in the hysteresis region is at least +10% or up to −10% of the difference between the target current value $I_L$ at the lower limit of the reactive gas flow rate in the hysteresis region and the target current value $I_H$ at the upper limit of the reactive gas flow rate in the hysteresis region.

It is noted that in either of the metal and reaction modes, the target voltage or current value recorded during the ascent of the reactive gas flow rate is substantially coincident with the target voltage or current value recorded during the descent of the reactive gas flow rate.

In a more preferred embodiment, the other layer is sputter deposited while the reactive gas flow rate is set equal to or more than an average value between the lower and upper limits of the reactive gas flow rate in the hysteresis region. Differently stated, the other layer is preferably deposited at a reaction mode-adjoining side of the transition mode. According to the invention, a combination of a layer deposited at a reactive gas flow rate in the metal mode with another layer deposited at a reactive gas flow rate in the transition mode, especially a reactive gas flow rate equal to or higher than an average value between the lower and upper limits of reactive gas flow rate in the hysteresis region makes it possible to form a halftone phase shift film having a phase shift of 170 to 190°, specifically 175 to 185°, most specifically substantially 180° and a transmittance of up to 15%, specifically up to 10%, most specifically 3 to 10%, and featuring better in-plane uniformity of such optical properties although it is difficult in the prior art to form a halftone phase shift film having in-plane uniformity of optical properties such as phase shift and transmittance in the defined ranges.

With respect to the arrangement of the first and second layers to construct the halftone phase shift film, on the assumption that the reactive gas flow rate during deposition of the first layer is a reactive gas flow rate equal to or lower than the lower limit in the hysteresis region (i.e., metal mode) and the reactive gas flow rate during deposition of the second layer is a reactive gas flow rate inside the lower and upper limits of the reactive gas flow rate in the hysteresis region (i.e., transition mode), for example, when the second layer is disposed remotest from the substrate (surface side), better chemical resistance is available. Also, when the second layer is disposed remotest from the substrate (surface side) or closest to the substrate (substrate side), the layer on either side is effective for a reduction of reflectance. Further, from the aspect of controlling the etching of the halftone phase shift film, e.g., improving the precision of end detection, better results are obtained when the first layer is disposed closest to the substrate and the second layer is disposed otherwise. Exemplary multilayer structures include a two-layer structure of first and second layers, a three-layer structure of a first layer sandwiched between second layers, and alternating multilayer structures of at least four alternating first and second layers. For the halftone phase shift film composed of a plurality of layers exclusive of a surface oxidized layer to be described later, the first and second layers preferably account for 70 to 100%, most preferably 100% of its thickness.

While the halftone phase shift film is deposited by sputtering, either DC sputtering or RF sputtering may be employed. The target and sputtering gas may be selected as appropriate depending on the arrangement and composition of layers. Suitable silicon-containing targets include a silicon target (target consisting solely of silicon), a silicon nitride target, and a target containing silicon and silicon nitride. From these targets, transition metal-free films, for example, films of silicon base materials such as silicon oxide, silicon nitride and silicon oxynitride may be formed as the halftone phase shift film.

During deposition of the halftone phase shift film, a reactive gas which reacts with the target material and becomes a part of the film is used, for example, nitrogen gas ($N_2$ gas), oxygen gas ($O_2$ gas), nitrogen oxide gases ($N_2O$ gas, NO gas, $NO_2$ gas). In the sputtering gas, a rare gas such as helium, neon or argon gas may be used. The content of nitrogen and oxygen in the halftone phase shift film may be adjusted by using a nitrogen-containing gas and/or an oxygen-containing gas as the reactive gas, and adjusting the flow rate of such gas during reactive sputtering. The sputtering pressure is typically 0.01 to 1 Pa, preferably 0.03 to 0.2 Pa.

Each of layers belonging to the first layer or each of layers belonging to the second layer may be deposited under constant conditions or under stepwise or continuously varying conditions in thickness direction within the range of reactive gas flow rate satisfying the deposition conditions for each.

The halftone phase shift film may include a surface oxidized layer as the surface-side layer (or outermost layer) in order to suppress any change in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, and heating of a film at about 300° C. in an oxygen-containing atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment as mentioned above is preferred for forming a less defective layer.

Like conventional halftone phase shift photomask blanks, the halftone phase shift photomask blank of the invention may include a light-shielding film on the halftone phase shift film. The provision of the light-shielding film ensures that a halftone phase shift photomask includes a region capable of completely shielding exposure light. The light-shielding film may be made of any desired materials, preferably chromium-based materials so that the film may also be utilized as an auxiliary film during etching. The construction and material of the light-shielding film are known from many patent documents, for example, Patent Document 3 (JP-A 2007-033469) and Patent Document 4 (JP-A 2007-233179). One preferred film construction of the light-shielding film is a structure having a light-shielding film of Cr-based material and an antireflective film of Cr-based material for reducing reflection by the light-shielding film. Each of the light-shielding film and the antireflective film may be a single layer or multilayer. Suitable materials of which the Cr-based light-shielding film and Cr-based antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and the like.

The Cr-based light-shielding film and Cr-based antireflective film may be deposited by reactive sputtering using a chromium target or a chromium target having one or more of oxygen, nitrogen and carbon added thereto, and a sputtering gas based on a rare gas such as Ar, He or Ne, to which a gas selected from oxygen-containing gas, nitrogen-containing gas and carbon-containing gas is added depending on the desired composition of a film to be deposited.

In another version of the embodiment wherein a light-shielding film is provided, an auxiliary film or etch stop film of chromium base material as disclosed in Patent Document 5 (JP-A 2007-241065) may be formed on the halftone, phase shift film, and a light-shielding film of silicon, a silicon base compound or transition metal/silicon base compound be formed thereon.

Furthermore, a hard mask film may be formed on the light-shielding film. As the hard mask film, a film having different etching properties from the light-shielding film is desirable. For example, when the light-shielding film is a Cr base film, a film which can be etched with fluoride gas such as $SF_6$ or $CF_4$ is preferably used as the hard mask film. Suitable hard mask films include a silicon film, a film containing silicon and nitrogen and/or oxygen, and a film containing silicon, nitrogen and/or oxygen, and a transition metal such as molybdenum, tungsten, tantalum or zirconium.

The photomask blank may be processed into a photomask by a standard technique. For example, a halftone phase shift photomask blank comprising a halftone phase shift film and a light-shielding film or antireflective film of chromium base material deposited thereon may be processed as follows. First, a resist film adapted for electron beam (EB) lithography is formed on the chromium base material film of the halftone phase shift photomask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. Next, while the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In another example, a halftone phase shift photomask blank comprising a halftone phase shift film, a light-shielding film or antireflective film of chromium base material deposited thereon, and a hard mask film of silicon base material deposited thereon may be processed as follows. First, a resist film adapted for EB lithography is formed on the silicon base hard mask film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the silicon base hard mask film. Thereafter, oxygen-containing chlorine base dry etching is carried out for transferring the hard mask film pattern to the chromium base material film. The resist is removed at this point. Further, while the chromium base material film pattern is used as etching mask, fluorine base dry etching is carried out for transferring the pattern to the halftone phase shift film and at the same time, removing the silicon base hard mask film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In a photolithographic method for forming a pattern with a half pitch of up to 50 nm, typically up to 30 nm, and more typically up to 20 nm in a processable substrate, comprising the steps of forming a photoresist film on the processable substrate and exposing the photoresist film to light of wavelength up to 200 nm, typically ArF excimer laser (193 nm), through a patterned mask for transferring the pattern to the photoresist film, the halftone phase shift photomask of the invention is best suited for use in the exposure step.

The halftone phase shift photomask obtained from the photomask blank is advantageously applicable to the pattern forming process comprising projecting light to the photomask pattern including the pattern of halftone phase shift film for transferring the photomask pattern to an object (photoresist film) on the processable substrate. The irradiation of exposure light may be either dry exposure or immersion exposure. The halftone phase shift photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto.

Example 1

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The current flow across the target was measured while the flow rate of nitrogen gas was changed, obtaining a hysteresis curve. Specifically, a power of 1 kW was applied across the target, argon gas was fed at 17 sccm, and nitrogen gas was fed at 5 sccm into the chamber. In this state, sputtering was started. The flow rate of nitrogen gas was increased from 5 sccm by an increment of 0.1 sccm every second and finally to 50 sccm, and the final flow rate was held for 30 seconds. Thereafter, inversely the flow rate of nitrogen gas was reduced from 50 sccm by a decrement of 0.1 sccm every second and finally to 5 sccm. The current was plotted relative to the flow rate to draw a hysteresis curve as shown in FIG. 1. In FIG. 1, the solid-line curve represents the target current recorded during the ascent of nitrogen gas flow rate and the broken-line curve represents the target current recorded during the descent of nitrogen gas flow rate. A hysteresis region is defined between these curves.

In FIG. 1, the reactive gas (nitrogen gas) flow rate at a position depicted at A is 10.0 sccm, indicating metal mode. The reactive gas flow rate at a position depicted at C is 30.0 sccm, indicating transition mode which is inside the upper and lower limits of nitrogen gas flow rate in the hysteresis region. At this point, the difference between the target current value $I_L$ at the lower limit of nitrogen gas flow rate in the hysteresis region and the target current value $I_H$ at the upper limit of nitrogen gas flow rate in the hysteresis region is 0.57 A. Also at the position C, the difference between the target current value $I_A$ recorded during the ascent of nitrogen gas flow rate and the target current value $I_D$ recorded during the descent of nitrogen gas flow rate is 9% of the difference between the target current value $I_L$ at the lower limit of nitrogen gas flow rate in the hysteresis region and the target current value $I_H$ at the upper limit of nitrogen gas flow rate in the hysteresis region.

In FIG. 1, the reactive gas flow rate at a position depicted at B is 19.1 sccm, indicating transition mode. At the position B, the difference between the target current value $I_A$ recorded during the ascent of nitrogen gas flow rate and the target current value $I_D$ recorded during the descent of nitrogen gas flow rate is 14% of the difference between the target current value $I_L$ at the lower limit of nitrogen gas flow rate in the hysteresis region and the target current value $I_H$ at the upper limit of nitrogen gas flow rate in the hysteresis region.

On the basis of the hysteresis curve of FIG. 1, sputtering was performed on a quartz substrate of 152 mm squares and 6.35 mm thick, using a silicon target as the sputter target, and argon and nitrogen gases as the sputtering gas. Under the metal mode conditions equal to or below the lower limit of nitrogen gas flow rate in the hysteresis region (conditions depicted at A in FIG. 1, argon gas flow rate 17.0 sccm, nitrogen gas flow rate 10.0 sccm, and target applied power 1 kW), a first layer having a composition of Si:N=62:38 in atomic ratio was deposited. Next, sputtering was performed on the first layer. Under the transition mode conditions inside the upper and lower limits of nitrogen gas flow rate in the hysteresis region (conditions depicted at C in FIG. 1, argon gas flow rate 17.0 sccm, nitrogen gas flow rate 30.0 sccm, and target applied power 1 kW), a second layer having a composition of Si:N=46:54 in atomic ratio was deposited. There was obtained a halftone phase shift film consisting of the first and second layers of SiN. The halftone phase shift film had a phase shift of 177 deg, a transmittance of 6.0%, and a thickness of 67 nm. An in-plane distribution of phase shift was –0.3% and an in-plane distribution of transmittance was 1.3%, indicating satisfactory in-plane uniformity.

Notably, the in-plane distribution of phase shift or transmittance is determined by measuring a phase shift or transmittance at the intersection between orthogonal lines on the surface of the substrate having the halftone phase shift film deposited thereon and at an arbitrary point spaced a distance of 95 mm on the orthogonal line from the intersection and computing according to the following equation (3-1) or (3-2).

In-plane distribution of phase shift (%)=[PS(I)−PS(E)]/[(PS(I)+PS(E))/2]×100     (3-1)

wherein PS(I) is a phase shift at the intersection and PS(E) is a phase shift at the arbitrary point.

In-plane distribution of transmittance (%)=[T(I)−T(E)]/[(T(I)+T(E))/2]×100     (3-2)

wherein T(I) is a transmittance at the intersection and T(E) is a transmittance at the arbitrary point.

Comparative Example 1

On the basis of the hysteresis curve of FIG. 1 obtained in Example 1, sputtering was performed on a quartz substrate of 152 mm squares and 6.35 mm thick, using a silicon target as the sputter target, and argon and nitrogen gases as the sputtering gas. Under the transition mode conditions inside the upper and lower limits of nitrogen gas flow rate in the hysteresis region (conditions depicted at B in FIG. 1, argon gas flow rate 17.0 sccm, nitrogen gas flow rate 19.1 scam, and target applied power 1 kW), a halftone phase shift film in the form of a single SiN layer having a composition of Si:N=47:53 in atomic ratio was deposited. The halftone phase shift film had a phase shift of 177 deg, a transmittance of 6.0%, and a thickness of 62 nm. An in-plane distribution of phase shift was −1.0% and an in-plane distribution of transmittance was −10.8%, indicating inferior in-plane uniformity.

Japanese Patent Application Nos. 2015-072925 and 2015-074783 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a halftone phase shift photomask blank comprising the step of depositing a halftone phase shift film containing silicon and nitrogen and/or oxygen on a transparent substrate, by reactive sputtering of a silicon-containing target with a reactive gas containing nitrogen and/or oxygen, the halftone phase shift film comprising first and second layers, wherein provided that a hysteresis curve defining a hysteresis region is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas, one layer of the first and second layers is sputter deposited while the flow rate of the reactive gas is set equal to or lower than the lower limit of the flow rate of the reactive gas in the hysteresis region, and the other layer is sputter deposited while the flow rate of the reactive gas is set inside the lower and upper limits of the flow rate of the reactive gas in the hysteresis region.

2. The method of claim 1 wherein the other layer is sputter deposited while the flow rate of the reactive gas is set such that the difference between a target voltage value $V_A$ recorded during the ascent of the reactive gas flow rate and a target voltage value $V_D$ recorded during the descent of the reactive gas flow rate is within ±15% of the difference between the target voltage value $V_L$ at the lower limit of the reactive gas flow rate in the hysteresis region and the target voltage value $V_H$ at the upper limit of the reactive gas flow rate in the hysteresis region, or the difference between a target current value $I_A$ recorded during the ascent of the reactive gas flow rate and a target current value $I_D$ recorded during the descent of the reactive gas flow rate is within ±15% of the difference between the target current value $I_L$ at the lower limit of the reactive gas flow rate in the hysteresis region and the target current value $I_H$ at the upper limit of the reactive gas flow rate in the hysteresis region.

3. The method of claim 1 wherein the other layer is sputter deposited while the reactive gas flow rate is set equal to or more than an average value between the lower and upper limits of the reactive gas flow rate in the hysteresis region.

4. The method of claim 1 wherein the reactive gas contains nitrogen ($N_2$) gas or oxygen ($O_2$) gas.

5. The method of claim 1 wherein the silicon-containing target is a target consisting of silicon.

6. The method of claim 5 wherein the halftone phase shift film is free of transition metals.

* * * * *